(12) United States Patent
Coonen et al.

(10) Patent No.: US 8,041,886 B2
(45) Date of Patent: Oct. 18, 2011

(54) SYSTEM AND METHOD OF MANAGING MEMORY

(75) Inventors: Daniel J. Coonen, Longmont, CO (US); Timothy R. Feldman, Louisville, CO (US)

(73) Assignee: Seagate Technology LLC, Cupertino, CA (US)

( * ) Notice: Subject to any disclaimer, the term of this patent is extended or adjusted under 35 U.S.C. 154(b) by 625 days.

(21) Appl. No.: 12/210,697

(22) Filed: Sep. 15, 2008

(65) Prior Publication Data

US 2010/0070679 A1    Mar. 18, 2010

(51) Int. Cl.
*G06F 13/00* (2006.01)
(52) U.S. Cl. ......................................... 711/103
(58) Field of Classification Search .................. None
See application file for complete search history.

(56) References Cited

U.S. PATENT DOCUMENTS

| | | | |
|---|---|---|---|
| 5,053,990 A | 10/1991 | Kreifels et al. | 364/900 |
| 5,270,979 A | 12/1993 | Harari et al. | 365/218 |
| 5,357,475 A | 10/1994 | Hasbun et al. | 365/218 |
| 5,388,083 A | 2/1995 | Assar et al. | 365/218 |
| 5,479,638 A | 12/1995 | Assar et al. | 395/430 |
| 5,787,484 A | 7/1998 | Norman | 711/159 |
| 5,835,935 A | 11/1998 | Estakhri et al. | 711/103 |
| 5,928,370 A | 7/1999 | Asnaashari | 714/48 |
| 5,991,517 A | 11/1999 | Harari et al. | 395/182.01 |
| 6,005,809 A | 12/1999 | Sung et al. | 365/185.29 |
| 6,034,897 A | 3/2000 | Estakhri et al. | 365/185.33 |
| 6,040,997 A | 3/2000 | Estakhri | 365/185.33 |
| 6,411,546 B1 | 6/2002 | Estakhri et al. | 365/185.11 |
| 6,414,876 B1 | 7/2002 | Harari et al. | 365/185.22 |
| 6,438,665 B2 | 8/2002 | Norman | 711/159 |
| 6,591,327 B1 | 7/2003 | Briner et al. | 711/103 |
| 7,313,030 B2 | 12/2007 | Lohse et al. | 365/185.33 |

*Primary Examiner* — Duc Doan
(74) *Attorney, Agent, or Firm* — Theodore M. Magee; Westman, Champlin & Kelly, P.A.

(57) ABSTRACT

The disclosure is related to systems and methods of management of memory. In a particular embodiment, a system is disclosed that comprises a control circuit adapted to compare a second data set to a first data set and to selectively replace the first data set with the second data set without performing an erase operation based on the comparison, wherein the erase operation is not performed when the first data set and the second data set differ only when locations of the second data set include a first logic value corresponding to one or more locations of the first data set that include a second logic value.

20 Claims, 5 Drawing Sheets

US 8,041,886 B2

SYSTEM AND METHOD OF MANAGING MEMORY

FIELD OF THE DISCLOSURE

The present disclosure is generally related to managing memory. Further, the present disclosure is also generally related to managing erasure of data in a memory.

DETAILED DESCRIPTION

Figure 1:
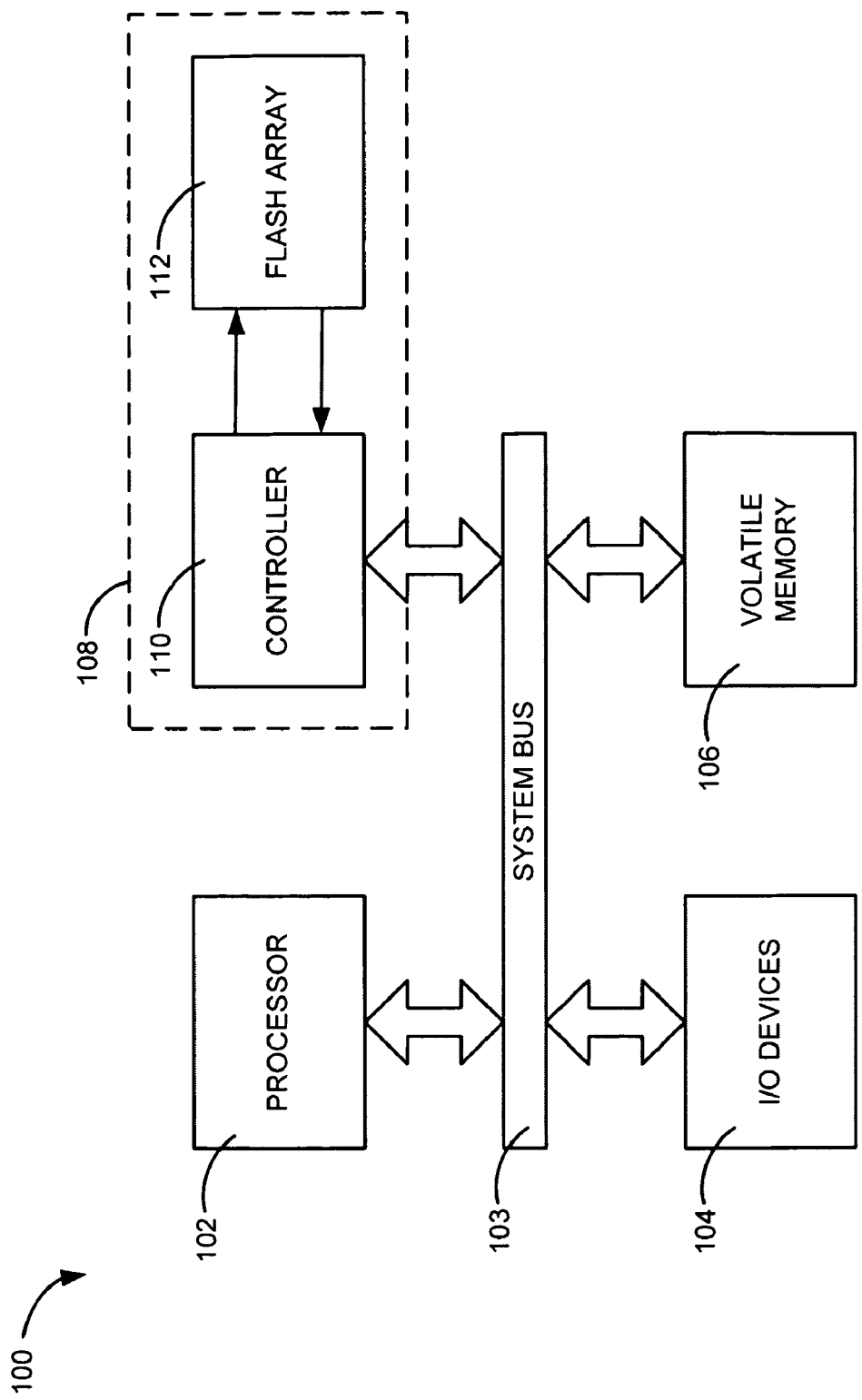
FIG. 1 is a diagram of an illustrative embodiment of a system of memory management.

In the following detailed description of the embodiments, reference is made to the accompanying drawings which form a part hereof, and in which are shown by way of illustration of specific embodiments. It is to be understood that other embodiments may be utilized and structural changes may be made without departing from the scope of the present disclosure.

The disclosure is related to systems and methods of memory management. The systems and methods described herein are particularly useful for flash memory systems; however, the systems and methods described herein can be applied to any type of memory system.

When writing new data, some memory devices, such as flash memory devices, may require a whole block of old data to be erased prior to writing the new data to the block. When a flash memory device erases blocks of memory, all bits end up in a single state. Typically, this state is set to "1". Subsequent writes can change bits of this block to the other state, typically "0". However, a flash memory device has a limited number of successful erases it can perform. This limit is what usually will cause a flash memory device to reach it's end-of-life, that is the flash memory device may no longer be usable to store data.

In a particular embodiment, a system is disclosed that includes a control circuit adapted to compare a second data set to a first data set and to selectively replace the first data set with the second data set without performing an erase operation based on the comparison. Also, the control circuit is adapted such that the erase operation is not performed when the first data set and the second data set differ only when locations of the second data set include a first logic value corresponding to one or more locations of the first data set that include a second logic value.

In another particular embodiment, a method is disclosed that includes comparing a first data set stored at a first position in a memory to a second data set to be written to the first position and determining a difference between the second data set and the first data set. The method also includes selectively writing the second data set to the first position without first erasing the first data set when the difference includes the second data set having a first logic value stored in a location corresponding to a location that the first data set has a second logic value stored.

In yet another particular embodiment, a system is disclosed that includes a processor and a memory circuit coupled to the processor. The memory circuit includes an interface to receive commands and data from the processor, a memory array to store a first data set at a first position, and a control circuit coupled to the memory array. The control circuit is adapted to compare a second data set to the first data set and to selectively replace the first data set with the second data set without performing an erase operation based on the comparison. Also, the control circuit is adapted such that the erase operation is not performed when the first data set and the second data set differ only when locations of the second data set include a first logic value corresponding to one or more locations of the first data set that include a second logic value.

Referring to FIG. 1, a particular embodiment of a system of memory management is shown and generally designated 100. The system of memory management 100 may include a processor 102 connected to a system bus 103 which also can be connected to input/output (I/O) devices 104, such as a keyboard, monitor, modem, storage device, or pointing device. The system bus 103 may also be coupled to a memory 106, which may be a random access volatile memory, such as dynamic random access memory (DRAM). The system bus may also be coupled to a memory device 108. In a particular embodiment, the memory device 108 comprises a non-volatile flash memory device.

The memory device 108 may include a controller 110, which may be coupled to the processor 102 via a connection through the system bus 103. The memory device 108 may also contain an array of memory cells 112. The array of memory cells 112 may include one or more integrated circuit memory chips.

During operation, the processor 102 may send a command and data to the memory device 108 to retrieve or store data. The controller 110 can receive the command and data from the processor 102 and then determine when to store or retrieve data from the array of memory cells 112.

In a particular embodiment, when a command and data is received from the processor 102 to store the data, the controller 110 may compare the received data to data previously stored at a specific location of the array of memory cells 112 and to selectively replace the previously stored data with the received data without performing an erase operation. In a particular embodiment, the array of memory cells 112 may comprise memory, such as flash memory, that require an erase operation to be executed for a block of memory sectors to change any sector within the block from a low logic value to a high logic value.

The controller 110 may compare the received data with the previously stored data to select a process by which to fulfill the write command from the processor 102. Firstly, the controller 110 may selectively prevent a write of the received data to the specific location when there is no difference between the received data and the previously stored data. In this instance, the controller 110 may indicate to the processor 102 that the received data was stored and that the command was fulfilled. Thus, the processor 102, i.e. the host, may not be aware that the previously stored data was not replaced with the received data.

Secondly, when storing data to a particular location, the controller 110 may selectively choose not to perform an erase operation for the specific location when the previously stored data and the received data differ only in that the received data includes a low logic value in corresponding locations that the previously stored data has a high logic value. Thus, the controller 110 may store the received data without needing an erase operation.

Thirdly, the controller 110 may perform an erase operation and a write operation when the received data includes a high logic value in a corresponding location that the previously stored data has a low logic value.

Figure 2:
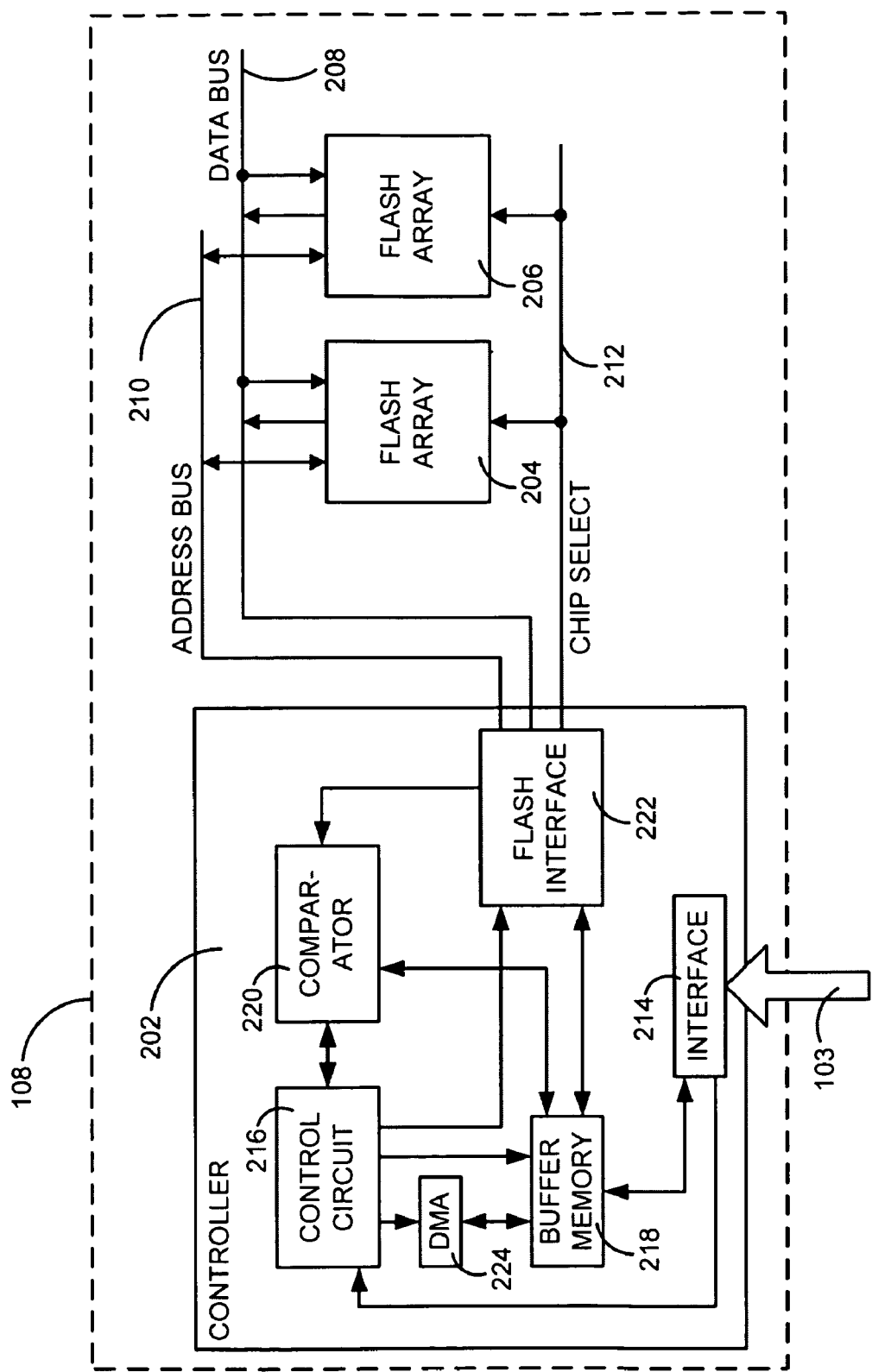
FIG. 2 is a diagram of another illustrative embodiment of a system of memory management.

Referring to FIG. 2, a particular embodiment of the memory device 108 is shown. The memory device 108 may include a controller 202 coupled to a first memory array 204 and a second memory array 206 via a data bus 208, an address bus 210, and a chip select bus 212. Each memory array may be a nonvolatile flash memory array. In another embodiment, more memory arrays may be coupled to the data bus 208, the address bus 210, and the chip select bus 212 than are shown in FIG. 2.

The controller 202 may be coupled to the system bus 103 via an interface 214 that can receive and send commands and data to a host, such as the processor 102 in FIG. 1. The interface 214 may pass the command to control circuit 216 for processing and also store the received data in a buffer memory 218. The buffer memory may provide the received data to a comparator 220 and a memory interface 222. In a particular embodiment, the memory interface 222 may be a flash memory interface.

The memory interface 222 can receive data from the buffer memory 218 to be written to one of the memory arrays 204 or 206 and receive address bits from the control circuit 216. The memory interface 222 may assert corresponding data and address bits with appropriate timing and format to a selected flash array. Memory interface 222 may also read previously stored data from any selected sector of memory array 204 or 206.

When the control circuit 216 receives a command via the interface 214 to write data to a particular address of a memory array, the control circuit may cause the memory interface 222 to retrieve previously stored data from the particular address and supply the previously stored data to the comparator 220. The comparator 220 may compare each bit of the received data to the previously stored data and provide the results to the control circuit 216.

The control circuit 216 may include a write register having a write bit to indicate when the control circuit is to write the received data set and an erase register having an erase bit to indicate when the control circuit 216 is to erase the previously stored data prior to writing the received data. The control circuit 216 may then selectively erase the previously stored data based on the erase bit and/or write the received data based on the write bit.

The control circuit 216 may selectively assert the erase bit or the write bit based on the results from the comparator 220. The control circuit 216 may select not to assert either the erase bit or the write bit to prevent a write of the received data to the particular address when there is no difference between the received data and the previously stored data. In this instance, the controller 202 may indicate to the host that the received data was stored and that the command was fulfilled. Thus, the host may not be aware that the previously stored data was not replaced with the received data.

Also, the control circuit 216 may select to assert the write bit and not assert the erase bit when the previously stored data and the received data differ only in that the received data includes a low logic value in corresponding locations that the previously stored data has a high logic value. Thus, the controller 202 may store the received data without needing an erase operation.

In addition, the control circuit 216 may select to assert the write bit and the erase bit when the received data includes a high logic value in a corresponding location that the previously stored data has a low logic value. The control circuit 216 may also be coupled to a direct memory address (DMA) controller 224 to allow the control circuit 216 to access the memory arrays 204 and 206 for reading and writing data.

Figure 3:
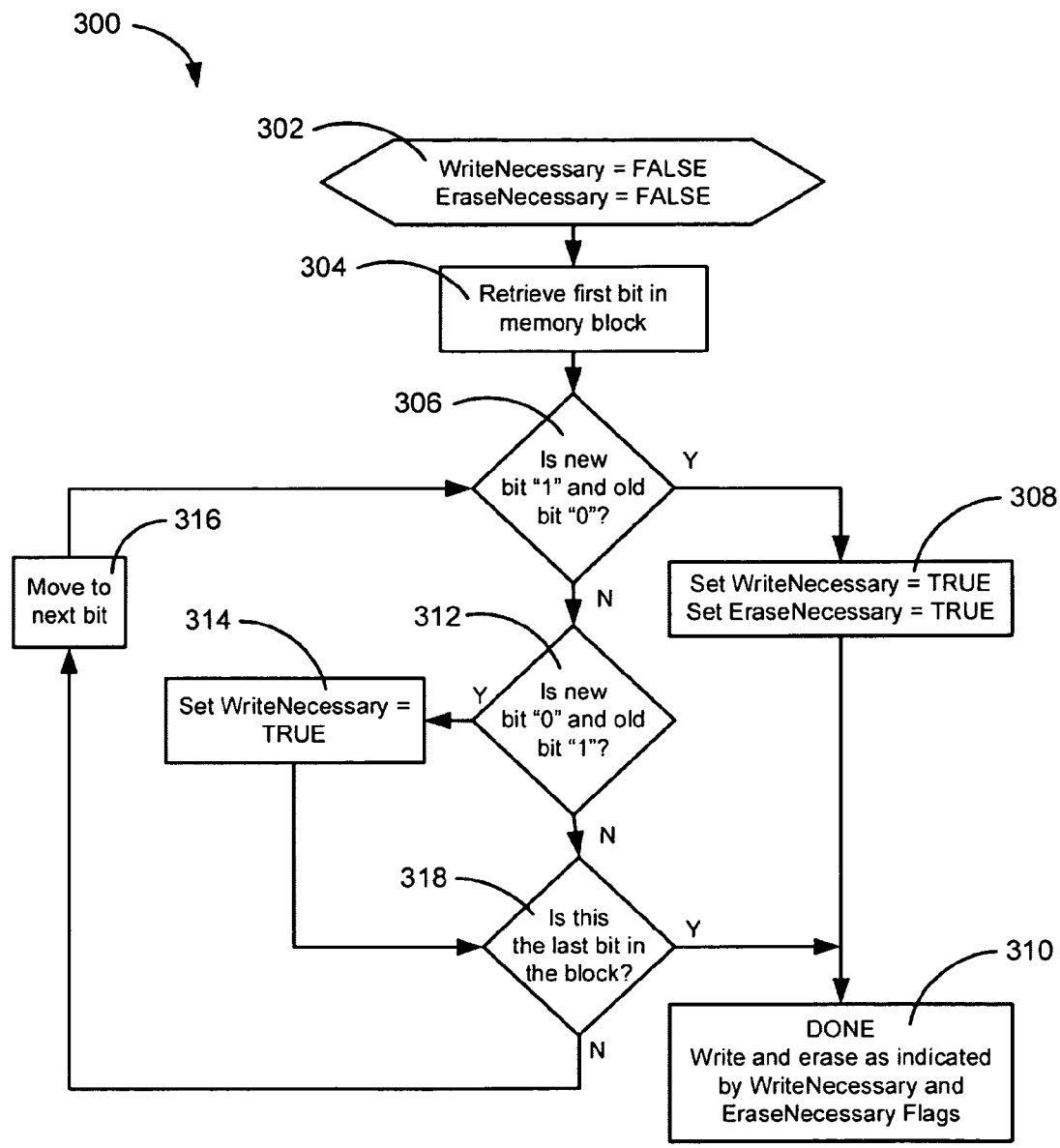
FIG. 3 is a flow diagram of an embodiment of a method of memory management.

Referring to FIG. 3, a flow diagram of a particular illustrative embodiment of a method of memory management is shown and generally designated 300. The method 300 may be implemented via the controller 108 or the controller 202. The method 300 may include setting a write flag, or write bit, to false and setting an erase flag, or erase bit, to false, at 302. The method may then retrieve a first bit of a previously stored data block from a memory address, at 304, and may compare, bit by bit, the previously stored data to newly received data that has been indicated to be stored at the same data block.

The method 300 may also include a first comparison to determine when the new bit is a logical one value and the old bit is a logical zero value, at 306. When the new bit is a logical one value and the old bit is a logical zero value, the method 300 may set the erase flag and the write flag to true, at 308. The method 300 may then include erasing the previously stored data when the erase flag is to true and storing the received data when the write flag is set to true, at 310.

Returning to the first comparison, when the new bit is not a logical one value or the old bit is not a logical zero value, the method 300 may include a second comparison to determine when the new bit is a logical zero value and the old bit is a logical one value, at 312. When the new bit is a logical zero value and the old bit is a logical one value, the method 300 may set the write flag to true, at 314. After the write flag is set to true, at 314, or when the old bit is not a logical one value, at 312, the method 300 may then determine if the new bit is the last bit in the block that may be written, at 318.

When the new bit is the last bit in the block, at 318, the method 300 may then include writing the received data when the write flag is set to true, at 310. When the new bit is not the last bit in the block, at 318, the method 300 may then move to the next bit in the block, at 316, and return to the first comparison, at 306. The method 300 will end when either all the bits in the block have been compared or the erase flag has been set, at 308.

Figure 4:
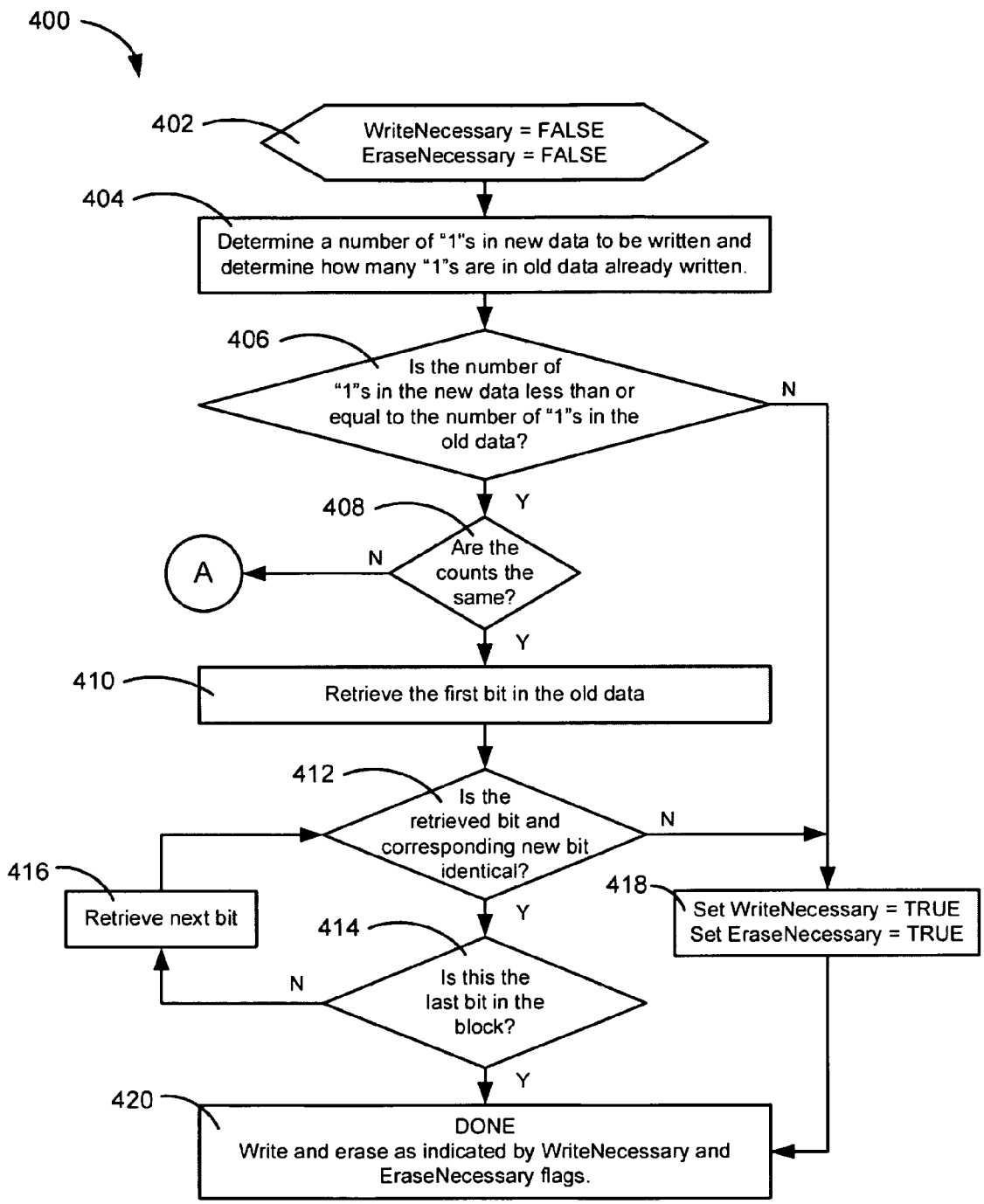
FIG. 4 and FIG. 5 are flow diagrams of another embodiment of a method of memory management.
Figure 5:
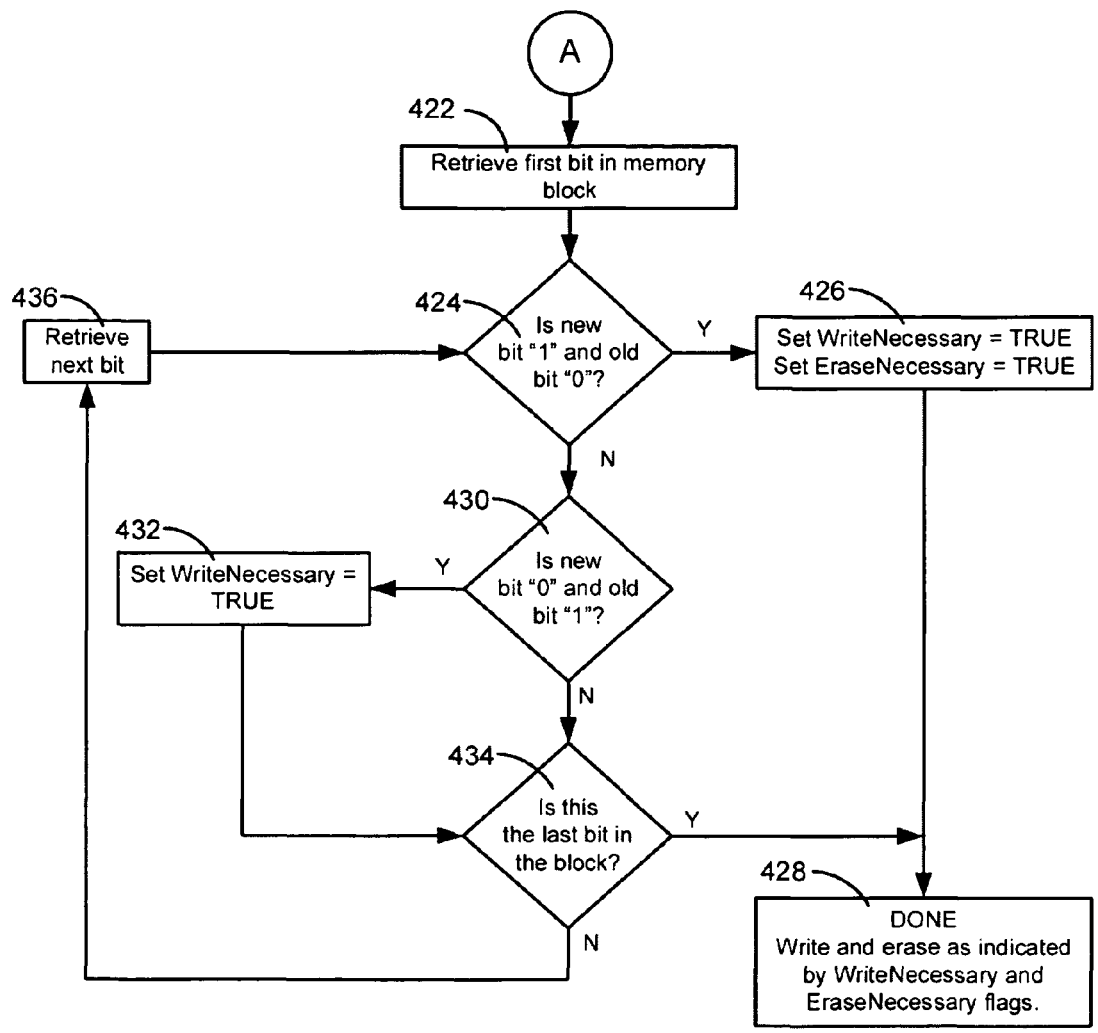

Referring to FIG. 4 and FIG. 5, a flow diagram of another particular illustrative embodiment of a method of memory management is shown and generally designated 400. The method 400 may be implemented via the controller 108 or the controller 202. The method 400 may include setting a write flag, or write bit, to false and setting an erase flag, or erase bit, to false, at 402.

The method 400 may then include determining a number of logical one values that are in newly received data to be written to a specific address and determining a number of logical one values that are in previously written data at the specific address, at 404. The method 400 may then determine if the number of logical one values in the received data is less than or equal to the number of logical one values in the old data. When the number of logical one values in the received data is not less than or equal to the number of logical one values in the old data, the method 400 may set the erase flag and the write flag to true, at 418. The method 400 may then include erasing the previously stored data when the erase flag is to true and storing the received data when the write flag is set to true, at 420.

When the number of logical one values in the received data is less than or equal to the number of logical one values in the old data, at 406, the method 400 includes determining if the number of logical one values in the received data is equal to the number of logical one values in the old data, at 408. When the number of logical one values in the received data is equal to the number of logical one values in the old data, the method 400 may include retrieving a first bit of the previously written data, at 410. The method 400 then may include determining if the retrieved bit and the corresponding new bit identical, at 412.

When the retrieved bit and the corresponding new bit are not identical, at 412, the method 400 may set the erase flag and the write flag to true, at 418. The method 400 may then include erasing the previously stored data when the erase flag is true and storing the received data when the write flag is true, at 420.

When the retrieved bit and the corresponding new bit are identical, at 412, the method 400 may include determining if the retrieved bit is the last bit in the block, at 414. When the retrieved bit is the last bit in the block, the method 400 ends, at 420. When the retrieved bit is not the last bit in the block, the method 400 may retrieve the next bit, at 416, and return to determine if the retrieved bit is identical to the corresponding new bit, at 412.

When the number of logical one values in the received data is not equal to the number of logical one values in the old data, at 408, the method 400 may include retrieving a first bit of a previously stored data block from a memory address, at 422, and then making a first comparison to determine when a new bit is a logical one value and the previously stored bit is a logical zero value, at 424. When the new bit is a logical one value and the previously stored bit is a logical zero value, the method 400 may set the erase flag and the write flag to true, at 426. The method 400 may then include erasing the previously stored data when the erase flag is to true and storing the received data when the write flag is set to true, at 428.

Returning to the first comparison, when the new bit is not a logical one value or the previously stored bit is not a logical zero value, the method 400 may include a second comparison to determine when the new bit is a logical zero value and the previously stored bit is a logical one value, at 430. When the new bit is a logical zero value and the previously stored bit is a logical one value, the method 400 may set the write flag to true, at 432. After the write flag is set to true, at 432, or when the previously stored bit is not a logical one value, at 430, the method 400 may then determine if the retrieved bit is the last bit in the block that may be written, at 434.

When the retrieved bit is the last bit in the block, at 434, the method 400 may then include writing the received data if the write flag is set to true, at 428. When the retrieved bit is not the last bit in the block, at 434, the method 400 may then retrieve the next bit in the block, at 436, and return to the first comparison, at 424. The method 400 will end when either all the bits in the block have been compared or the erase flag has been set, at 426.

In accordance with various embodiments, the methods described herein may be implemented as one or more software programs running on a computer processor or controller, such as the controller 110 or the controller 202. Dedicated hardware implementations including, but not limited to, application specific integrated circuits, programmable logic arrays and other hardware devices can likewise be constructed to implement the methods described herein.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be reduced. Accordingly, the disclosure and the figures are to be regarded as illustrative rather than restrictive One or more embodiments of the disclosure may be referred to herein, individually and/or collectively, by the term "invention" merely for convenience and without intending to limit the scope of this application to any particular invention or inventive concept. Moreover, although specific embodiments have been illustrated and described herein, it should be appreciated that any subsequent arrangement designed to achieve the same or similar purpose may be substituted for the specific embodiments shown. This disclosure is intended to cover any and all subsequent adaptations or variations of various embodiments. Combinations of the above embodiments, and other embodiments not specifically described herein, will be apparent to those of skill in the art upon reviewing the description.

The Abstract of the Disclosure is provided to comply with 37 C.F.R. §1.72(b) and is submitted with the understanding that it will not be used to interpret or limit the scope or meaning of the claims. In addition, in the foregoing Detailed Description, various features may be grouped together or described in a single embodiment for the purpose of streamlining the disclosure. This disclosure is not to be interpreted as reflecting an intention that the claimed embodiments require more features than are expressly recited in each claim. Rather, as the following claims reflect, inventive subject matter may be directed to less than all of the features of any of the disclosed embodiments.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A system comprising:
a control circuit adapted to connect to a memory and adapted to compare a first data set at a first position in the memory to a second data set and to selectively replace the first data set at the first position with the data of the second data set without performing an erase operation based on the comparison; and
wherein the erase operation is not performed when the first data set and the second data set differ only when locations of the second data set include a first logic value corresponding to one or more locations of the first data set that include a second logic value.

2. The system of claim 1, wherein the first logic value equals zero and the second logic value equals one.

3. The system of claim 1, wherein the control circuit is further adapted to skip a write operation to write the second data set to the first position when there is no difference between the second data set and the first data set.

4. The system of claim 3, wherein the control circuit is further adapted to erase the first data set at the first position before writing the second data set to the first position when a difference between the second data set and the first data set is other than the second data set having the first logic value corresponding to one or more locations of the first data set that include the second logic value.

5. The system of claim 3, wherein the control circuit further comprises:
a write register including a write bit to indicate when the control circuit is to write the second data set to the first position;
an erase register including an erase bit to indicate when the control circuit is to erase the first data set at the first position prior to writing the second data set;
wherein the control circuit is further adapted to:
erase the first data set at the first position based on the erase bit; and
write the second data set at the first position based on the write bit.

6. The system of claim 5, wherein the control circuit further comprises:
a comparator coupled to the memory to compare the first data set to the second data set;
a buffer coupled to the comparator to store the second data set; and
a direct memory access controller coupled to the buffer and the memory, the direct memory access controller causing the second data set to be sent from the buffer to the memory when a write is allowed.

7. The system of claim 5, further wherein the memory requires the erase operation to be performed for the first position prior to storing the second data set in the first position when the second data set has a high logic value where the first data set has a low logic value.

8. The system of claim 1, wherein the control circuit compares the first data set and the second data set by comparing bit states between corresponding positions of the second data set and the first data set.

9. The system of claim 8, wherein the control circuit is further adapted to erase the first data set at the first position and to write the second data set to the first position when the second data set has a one value at a specific bit location and the first data set has a zero value at the specific bit location.

10. The system of claim 1, wherein the control circuit compares the first data set and the second data set by comparing a difference in a first sum of states for the second data set and a second sum of states for the first data set.

11. The system of claim 1, wherein the memory comprises an array of nonvolatile flash memory cells.

12. A method comprising:
comparing a first data set stored at a first position in a memory to a second data set to be written to the first position;
determining a difference between the second data set and the first data set;
selectively writing the second data set to the first position without first erasing the first data set when the difference includes the second data set having a first logic value stored in a location corresponding to a location that the first data set has a second logic value stored.

13. The method of claim 12, further comprising preventing the second data set from being written to the first position when there is no difference between the second data set and the first data set.

14. The method of claim 12, further comprising:
erasing the first data set at the first position when there is a difference between the second data set and the first data set other than the second data set having the first logic value stored in a location corresponding to a location of the first data set that has the second logic value stored; and
writing the second data set at the first position.

15. The method of claim 12, further comprising setting a write flag based on the difference to indicate when a write is to be executed and setting an erase flag based on the difference to indicate when an erase is to be executed.

16. The method of claim 15, further comprising:
comparing each bit of the second data set to each corresponding bit of the first data set to determine the difference; and
setting the erase flag when a bit of the second data set is a one value and a corresponding bit of the first data set is a zero value.

17. A system comprising:
a processor; and
a memory circuit coupled to the processor comprising:
an interface to receive commands and data from the processor;
a memory array to store a first data set at a first position; and
a control circuit responsive to the interface to receive a second data set, the control circuit coupled to the memory array and adapted to compare the second data set to the first data set and to selectively replace the first data set at the first position with the data of the second data set without performing an erase operation;
wherein the control circuit does not perform the erase operation when the first data set and the second data set differ only in that one or more locations of the second data set has a low logic value where the first data set has a high logic value.

18. The system of claim 17, wherein the memory array comprises nonvolatile flash memory.

19. The system of claim 18, wherein the memory circuit further comprises:
a write register including a write bit to indicate when the control circuit is to write the second data set to the first position;
an erase register including an erase bit to indicate when the control circuit is to erase the first data set at the first position prior to writing the second data set;
wherein the control circuit is further adapted to:
erase the first data set at the first position based on the erase bit; and
write the second data set at the first position based on the write bit.

20. The system of claim 19, wherein the memory circuit is further adapted to:
disable the erase bit and the write bit to indicate a write is not to occur when there is no difference between the second data set and the first data set;
disable the erase bit and enable the write bit when the first data set and the second data differ and all differences between the first data set and the second data set occur when the second data set includes the low logic value in a location corresponding to a location of the first data set that includes the high logic value; and
enable the erase bit and the write bit when the first data set and the second data set differ and at least one difference occurs when the second data set includes the high logic value in a location corresponding to a location of the first data set that includes the low logic value.

* * * * *